(12) United States Patent
Chu et al.

(10) Patent No.: US 10,529,820 B2
(45) Date of Patent: Jan. 7, 2020

(54) METHOD FOR GALLIUM NITRIDE ON DIAMOND SEMICONDUCTOR WAFER PRODUCTION

(71) Applicant: BAE Systems Information and Electronic Systems Integration Inc., Nashua, NH (US)

(72) Inventors: Kanin Chu, Nashua, NH (US); Pane Chane Chao, Nashua, NH (US); Carlton T Creamer, Brookline, NH (US)

(73) Assignee: BAE Systems Information and Electronic Systems Integration Inc., Nashua, NH (US)

(*) Notice: Subject to any disclaimer, the term of this patent is extended or adjusted under 35 U.S.C. 154(b) by 1178 days.

(21) Appl. No.: 14/800,387

(22) Filed: Jul. 15, 2015

(65) Prior Publication Data

US 2019/0043709 A1  Feb. 7, 2019

Related U.S. Application Data

(60) Provisional application No. 62/024,774, filed on Jul. 15, 2014.

(51) Int. Cl.
*H01L 29/66* (2006.01)
*H01L 21/02* (2006.01)
*H01L 21/768* (2006.01)
*H01L 29/778* (2006.01)
*H01L 27/12* (2006.01)
(Continued)

(52) U.S. Cl.
CPC .... *H01L 29/66431* (2013.01); *H01L 21/0254* (2013.01); *H01L 21/2007* (2013.01); *H01L 21/6835* (2013.01); *H01L 21/76876* (2013.01); *H01L 23/3732* (2013.01); *H01L 27/1266* (2013.01); *H01L 29/778* (2013.01); *H01L 29/7786* (2013.01); *H01L 21/0475* (2013.01);
(Continued)

(58) Field of Classification Search
CPC ............. H01L 23/3732; H01L 29/1602; H01L 21/0254; H01L 29/66431; H01L 27/1266
See application file for complete search history.

(56) References Cited

U.S. PATENT DOCUMENTS

2012/0153294 A1* 6/2012 Korenstein ........... H01L 21/187
257/76
2014/0103399 A1* 4/2014 Suh ..................... H01L 29/1066
257/194

(Continued)

OTHER PUBLICATIONS

Chao et al., "A New High Power GaN-on-Diamond HEMT with Low-Temperature Bonded Substrate Technology", May 13, 2013, CS Mantech Conference, pp. 179-182.*

(Continued)

*Primary Examiner* — Selim U Ahmed
*Assistant Examiner* — Evan G Clinton
(74) *Attorney, Agent, or Firm* — Maine Cernota & Rardin; Scott J. Asmus

(57) ABSTRACT

A GaN on diamond wafer and method for manufacturing the same is provided. The method comprising: disposing a GaN device or wafer on a substrate, having a nucleation layer disposed between the substrate and a GaN layer; affixing the device to a handling wafer; removing the substrate and substantially all the nucleation layer; and bonding the GaN layer to a diamond substrate.

20 Claims, 8 Drawing Sheets

(51) Int. Cl.
*H01L 23/373* (2006.01)
*H01L 21/20* (2006.01)
*H01L 21/683* (2006.01)
H01L 21/04 (2006.01)
H01L 29/20 (2006.01)

(52) U.S. Cl.
CPC ....... *H01L 21/2011* (2013.01); *H01L 29/2003* (2013.01); *H01L 2221/68327* (2013.01)

(56) References Cited

U.S. PATENT DOCUMENTS

| | | | |
|---|---|---|---|
| 2014/0110722 A1* | 4/2014 | Kub | H01L 29/66462 257/77 |
| 2015/0214040 A1* | 7/2015 | Celler | H01L 21/76254 438/458 |
| 2015/0279945 A1* | 10/2015 | Francis | H01L 21/76254 257/77 |
| 2015/0372192 A1* | 12/2015 | Epler | H01L 33/16 257/76 |
| 2016/0064539 A1* | 3/2016 | Lu | H01L 29/66462 257/76 |

OTHER PUBLICATIONS

P.C. Chao, Kanin Chu, Jose Diaz, Carlton Creamer, Scott Sweetland, Ray Kallaher, Craig McGray, Glen D. Via and John Blevins, GaN-on-Diamond HEMTs with 11W/mm Output Power at 10GHz. MRS Advances, Available on CJO 2016 doi:10.1557/adv.2016.176, MRS Advances / FirstView Article / Mar. 2016, pp. 1-9 DOI: 10.1557/adv.2016.176, Published online: Mar. 7, 2016.

* cited by examiner

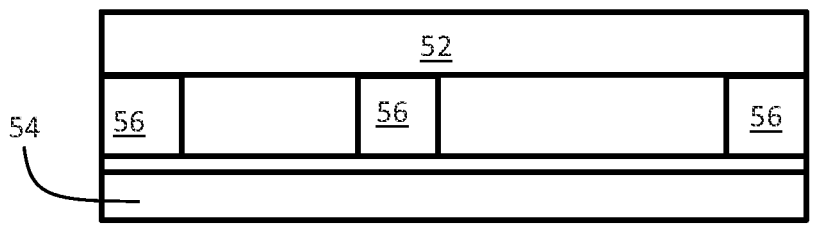
Fig. 4C
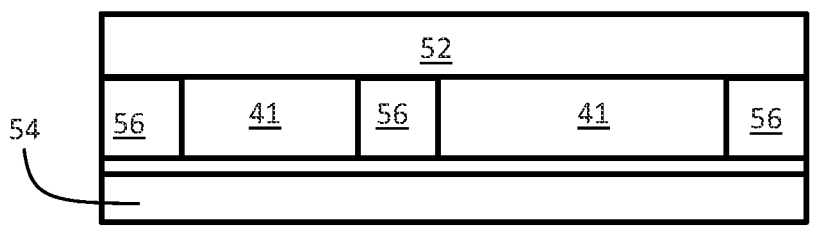
Fig. 4D
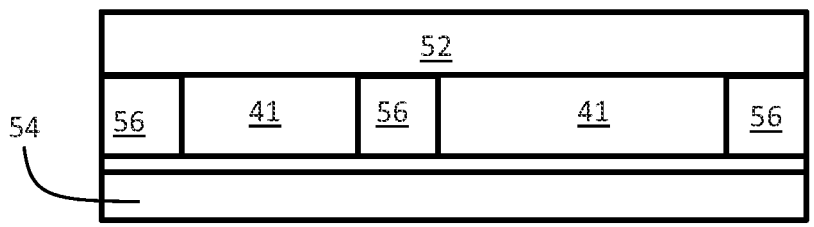
Fig. 4E
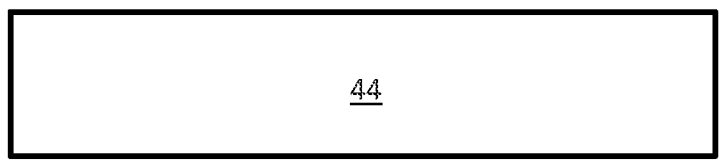

METHOD FOR GALLIUM NITRIDE ON DIAMOND SEMICONDUCTOR WAFER PRODUCTION

RELATED APPLICATIONS

This application claims the benefit of U.S. Provisional Applications No. 62/024,774, filed Jul. 15, 2014. This application is herein incorporated by reference in its entirety for all purposes.

STATEMENT OF GOVERNMENT INTEREST

This invention was made with United States Government support under Contract No. FA8650-09-C-5404 awarded by the United States Air Force and W31P4Q-12-C-0019 awarded by the United States Department of the Army. The United States Government has certain rights in this invention.

FIELD OF THE INVENTION

The invention relates to semiconductor fabrication, and more specifically, the fabrication of GaN wafers with high thermal conductivity substrates.

BACKGROUND OF THE INVENTION

In most modern military electronic systems, the electronic device is typically the warmest element in the system. Although the thermal resistance of many military high-power electronic components can be as large as that of the remaining elements of the system combined, spreaders, heatsinks or coldplates do not directly access the active region where heat is generated, and cannot materially affect the device junction temperature. Since the junction temperature of a power transistor is dominated by the intra-chip heat spreading capability, to lower the device temperature one needs to place materials with high thermal conductivities immediately adjacent to the hot spot of the chip. The conventional GaN HEMT technology (e.g. on SiC, sapphire or Si substrates) suffers from a thermal bottleneck at the chip level. Heat generated from the hot spot in the conventional GaN HEMT will need to go through several microns of poor thermal conductivity GaN epitaxial layer and nucleation layers before reaching the substrate, making devices run hot or and less reliable. The lack of an efficient thermal dissipation pathway results in high device junction temperature, which compromises both performance and reliability.

Known GaN-on-Diamond technology overcomes the thermal bottleneck by applying a high thermal conductivity substrate. Such wafers are formed in a process in which one grows a GaN epitaxial layer on a silicon (Si) substrate. The Si substrate is first removed from the thick GaN epitaxial layer layers (typically ~2 um) through chemical or mechanical means. A diamond substrate is then applied to the GaN epitaxial layer through very high temperature direct chemical vapor deposition (CVD) growth. The direct growth occurs at high temperatures 600-1000 C. Upon cool-down to room temperature, mismatch in coefficient of thermal expansion (CTE) between GaN and diamond results in significant wafer bow as well as tensile stress in the GaN epitaxial layers. This makes the fabrication of devices and circuits on such a wafer very challenging. The device reliability may also be affected with the extra epitaxial layer stress. The thick GaN epitaxial layer and the GaN to Si transition buffer layers and buffer layers to diamond substrate are significant thermal barriers in the device.

This process results in a number of disadvantages: a) The lower performance of GaN-on-Si as the starting epitaxial layer material results in lower GaN device performance, comparing to that of the industry standard GaN-on-SiC HEMT. b) The large wafer bow makes subsequent device processing difficult. c) High tensile stress in the GaN epitaxial film can lead to reduced device reliability. d) The device does not take the full advantage of the diamond high thermal conductivity due to the thick GaN epitaxial layer and buffer transition layers between the hot spot and the diamond substrate.

Device performance is also inhibited by mechanical stress experienced by the GaN due to wafer bowing.

What is needed therefore is a technique for providing a GaN on Diamond device having improved performance, decreased thermal mismatch, GaN tensile stress, and wafer bow improved use of the diamond wafer thermal conductivity.

SUMMARY OF THE INVENTION

One embodiment of the present invention provides a GaN on Diamond wafer, the system comprising: a diamond substrate; a layer of GaN bonded on said substrate at a low temperature, said layer of GaN being substantially free of a nucleation layer.

Another embodiment of the present invention provides such a wafer of claim 1 wherein said GaN layer is not greater than 0.2 µm thick.

A further embodiment of the present invention provides such a wafer wherein said GaN interfaces with said diamond substrate only in localized areas proximate to active devices.

Yet another embodiment of the present invention provides such a wafer wherein coefficient of thermal expansion mismatch between said GaN layer and said diamond substrate is minimized.

A yet further embodiment of the present invention provides such a wafer further comprising GaN devices disposed on said layer of GaN prior to the bonding of said GaN layer to said substrate.

One embodiment of the present invention provides method for manufacturing a GaN on Diamond device, the method comprising: disposing a GaN device on a substrate, having a nucleation layer disposed between said sapphire substrate and a GaN layer; affixing said device to a handling wafer; removing said sapphire substrate and substantially all said nucleation layer; bonding said GaN layer to a diamond substrate.

Another embodiment of the present invention provides such a method wherein said substrate is a substrate material selected from the group of materials consisting of Si, SiC, and Sapphire.

A further embodiment of the present invention provides such a method further comprising thinning said GaN layer prior to bonding said GaN device to said diamond substrate.

Yet another embodiment of the present invention provides such a method further comprising removing a portion of said GaN layer to an InAlN etch stop layer.

A yet further embodiment of the present invention provides such a method wherein said bonding comprises bonding said GaN layer to said diamond substrate with a low-temperature, low thermal resistance bond.

Even another embodiment of the present invention provides such a method wherein said bond comprises Van Der Waal bonds.

An even further embodiment of the present invention provides such a method further comprising annealing said GaN layer bonded to said diamond substrate.

Still another embodiment of the present invention provides such a method wherein said annealing is at up to approximately 400° C.

A still further embodiment of the present invention provides such a method further comprising removing not more than 90% of said GaN layer.

Even yet another embodiment of the present invention provides such a method wherein said step of removing said substrate and said substantially all said nucleation layer, wherein said substrate is sapphire comprises removal with a laser.

An even yet further embodiment of the present invention provides such a method, where wherein said step of removing said substrate and said substantially all said nucleation layer further comprises etching and or mechanical polishing.

Still yet another embodiment of the present invention provides such a method wherein said handling wafer is attached to said GaN device with an organic adhesive.

A still yet further embodiment of the present invention provides such a method further comprising removing said handling wafer.

Even yet another embodiment of the present invention provides such a method further comprising smoothing said diamond substrate before bonding said GaN layer to said diamond substrate.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

FIG. 4C is a block diagram illustrating a removal of a substrate from workpiece configured in accordance with a step in one embodiment of the present invention.

FIG. 4D is a block diagram illustrating etching of a GaN layer to remove thickness configured in accordance with a step in one embodiment of the present invention.

FIG. 4E is a block diagram illustrating provision of a diamond substrate configured in accordance with a step in one embodiment of the present invention.

DETAILED DESCRIPTION

A GaN-on-Diamond approach configured according to one embodiment uses low temperature bonding techniques (below 400 C) to attach diamond substrates to GaN layers. Mechanical stress due to thermal expansion mismatch between GaN and diamond is minimized, leading to smaller wafer bow, easier and higher yield wafer processing and improved device lifetime. Such embodiments also describe a method to uniformly reduce GaN epitaxial layer thickness to further improve device thermal property for higher performance and reliability.

Figure 1:
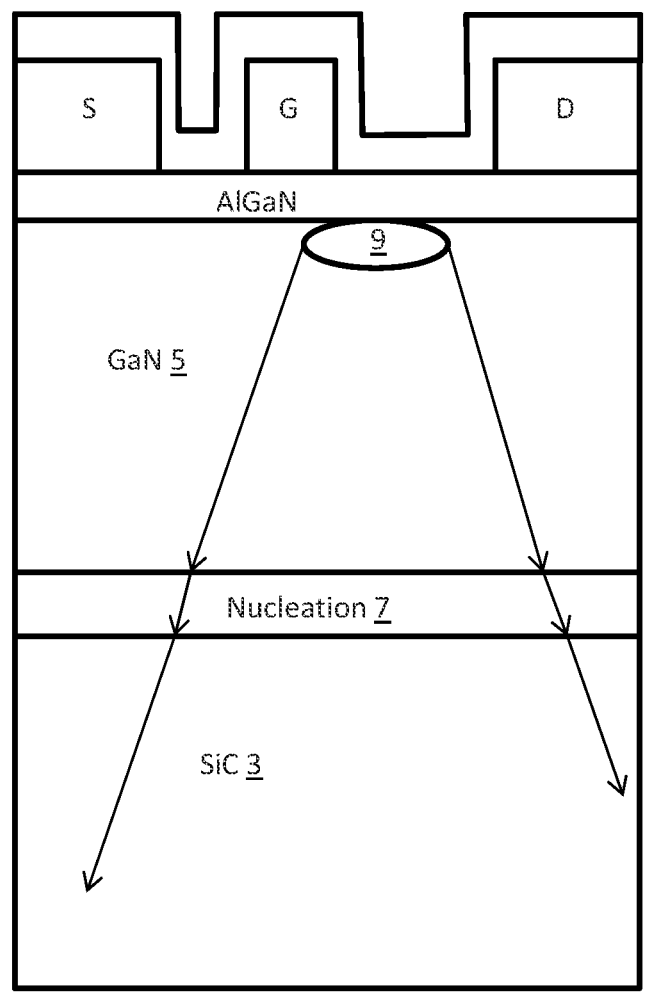
FIG. 1 is a block diagram illustrating a known GaN on SiC HEMT.
Figure 2:
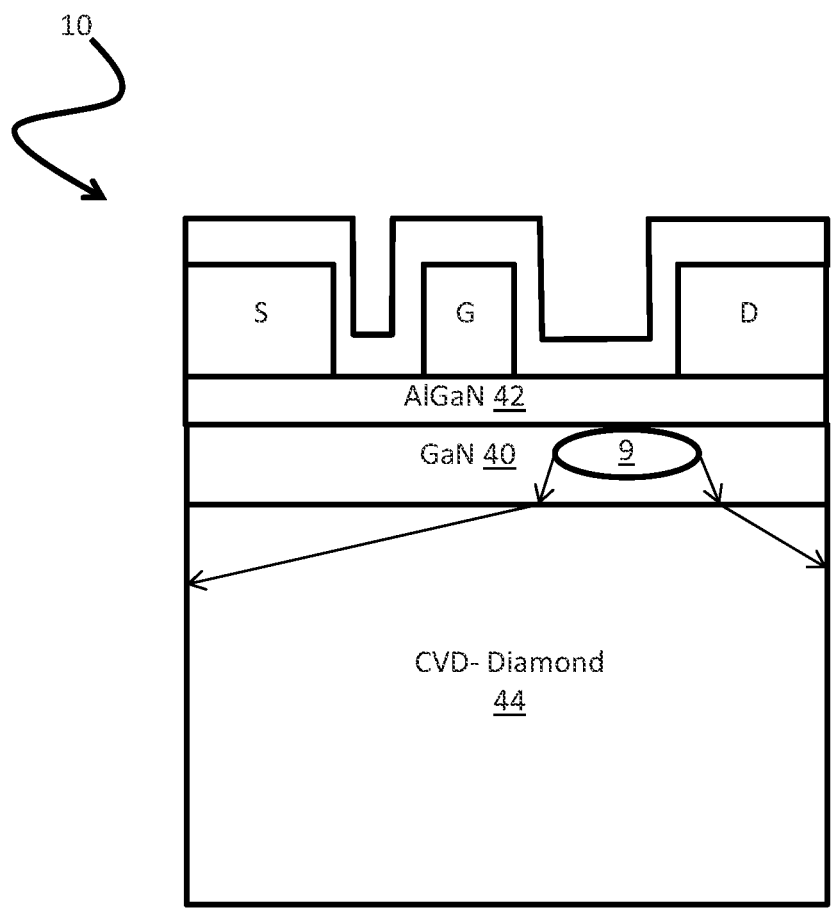
FIG. 2 is a block diagram illustrating a GaN on diamond HEMT configured in accordance with one embodiment of the present invention.

As illustrated in FIG. 1, a traditional GaN on SiC HEMT includes a thick GaN layer 5 and a nucleation layer 7. Heat from a hotspot 9 on a conventional must travel through the GaN layer and the nucleation layer before it begins to dissipate in the SiC layer 3. As seen in FIG. 2, embodiments of the present invention provide a wafer which includes a thinner GaN layer in comparison. In such an embodiment, the final GaN-on-diamond wafer 10 does not have a nucleation layer.

In contrast to conventional GaN-on-Diamond technology, embodiments of the present invention provide a process flow which starts with devices fabricated on flat GaN epitaxial layers formulated on SiC sapphire, or other suitable wafers using standard high yield GaN wafer processing technology. The sapphire substrates of such an embodiment are subsequently removed using an industry-standard pulsed laser, while embodiments utilizing Silicon or SiC substrates may be removed using chemical etching, mechanical polishing and combinations thereof. In such embodiments, an Aluminum Nitride (AlN) nucleation layer is removed, eliminating the thermal barrier presented by the high defect density layer. This takes full advantage of the heat spreading capability of the diamond.

Figure 3A:
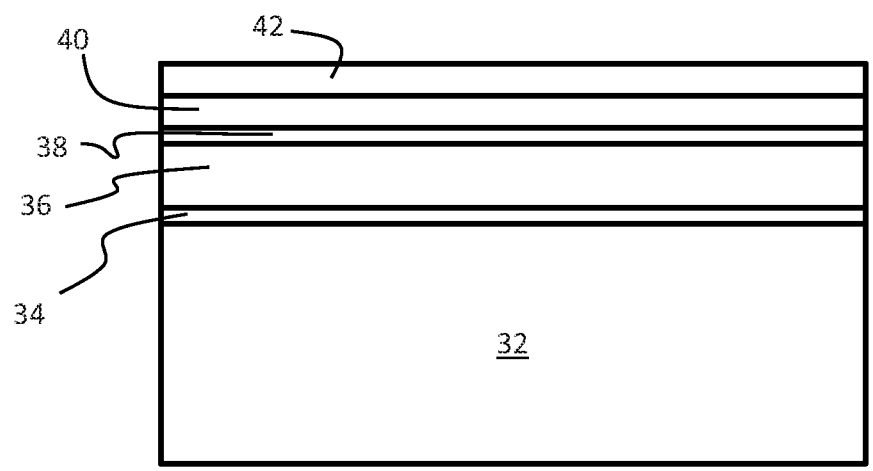
FIG. 3A is a block diagram illustrating a GaN workpiece configured in accordance with a step in one embodiment of the present invention.
Figure 3B:
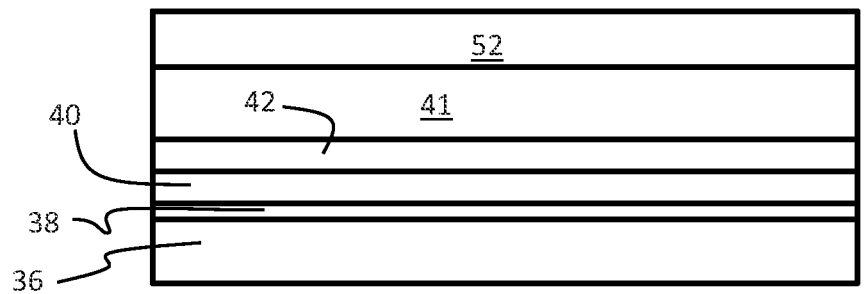
FIG. 3B is a block diagram illustrating a removal of a substrate and nucleation layer from workpiece configured in accordance with a step in one embodiment of the present invention.

A method for the manufacture of a GaN-on-Diamond transistor according to embodiments of the present invention is illustrated in FIGS. 3A-3D. In FIG. 3A, a sapphire, Silicon, or silicon carbide (SiC) substrate 32 is provided having an AlN Nucleation layer 34 disposed upon it, and upon which a GaN layer 36, an AlInN etch stop 38, a second GaN layer 40, and an AlGaN layer disposed upon it 42. In one such embodiment, the starting AlN nucleation layer 34 may be 200-2000 Å thick, the first GaN layer 36 may be 1-3 μm thick, the etch stop 38 may be 0.05-0.5 μm thick, the second GaN layer 40 may be 0.2-1.0 μm thick, and the AlGaN layer 42 may be 100-300 Å thick. An adhesive layer 41 may also be present. As noted above, the substrate 32 and AlN nucleation layer 34 are removed.

Figure 3C:
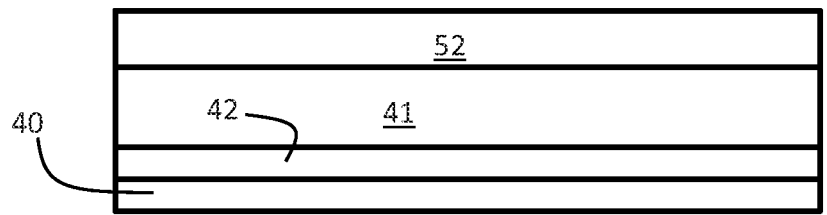
FIG. 3C is a block diagram illustrating a GaN layer on a carrier configured in accordance with a step in one embodiment of the present invention.

As illustrated in FIG. 3C, the removal process, according to one embodiment of the present invention, may uniformly remove up to 90% of the mostly high defect density, poor thermal conductivity GaN layer in the path from a hot spot to diamond heat sink. Removal to achieve a very thin GaN layer 40 allows formation of "GaN islands" so the GaN/diamond interface occurs only in localized areas at the active devices, therefore minimizing CTE mismatch stress buildup across the GaN/diamond interface.

In monolithic microwave integrated circuits (MMICs), passive components and transmission lines can be fabricated directly on the diamond substrate, mitigating CTE mismatch concerns.

Figure 3D:
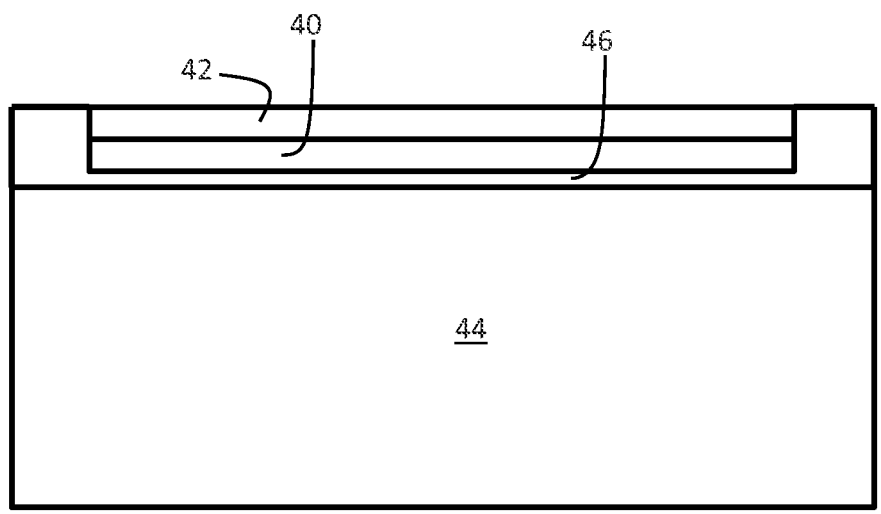
FIG. 3D is a block diagram illustrating a GaN bonded to a diamond substrate configured in accordance with a step in one embodiment of the present invention.

As illustrated in FIG. 3D, the GaN layer 40 is adhered to the diamond substrate 44, which in one embodiment is 50-500 μm in thickness. Low-temperature (<150° C.) polymer-based adhesive bonding 46 is used in one embodiment of the present invention and significantly reduces the impact of CTE mismatch between diamond and GaN active layers (low CTE×ΔT product) for improved reliability. In alternative embodiments, the bonding process may be van der Waal or covalent bonding.

Figure 4A:
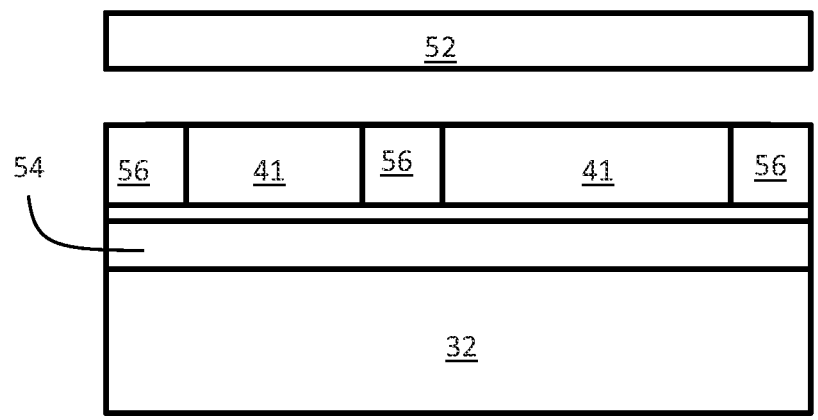
FIG. 4A is a block diagram illustrating a GaN on workpiece configured in accordance with a step in one embodiment of the present invention.
Figure 4B:
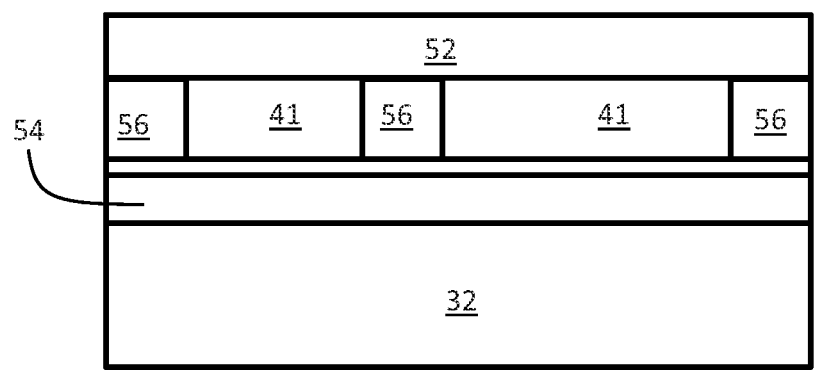
FIG. 4B is a block diagram illustrating a GaN on workpiece bonded to a handling wafer configured in accordance with a step in one embodiment of the present invention.
Figure 4F:
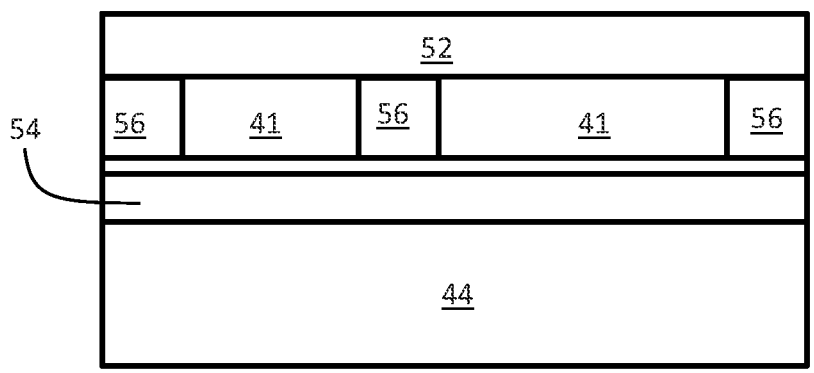
FIG. 4F is a block diagram illustrating bonding of a diamond substrate to a GaN layer configured in accordance with a step in one embodiment of the present invention.
Figure 4G:
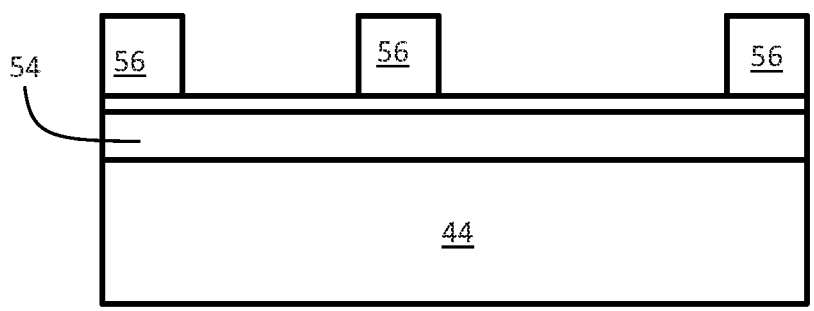
FIG. 4G is a block diagram illustrating removal of a handling wafer from a GaN on diamond HEMT configured in accordance with a step in one embodiment of the present invention.
Figure 4H:
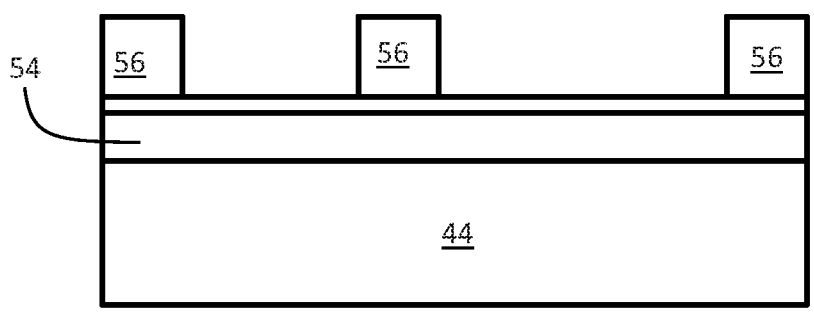
FIG. 4H is a block diagram illustrating heating of a GaN on diamond HEMT configured in accordance with a step in one embodiment of the present invention.
Figure 4H:
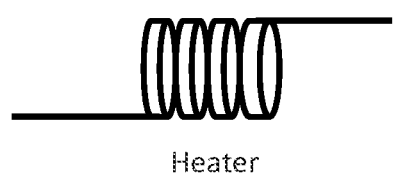

As illustrated in FIGS. 4A-4H, according to one embodiment, a GaN epitaxial layer on a suitable substrate (from a material such as Sapphire, Si, SiC) wafer 50 is low temperate bonded to a carrier 52, in some embodiments at a temperature before 400° C. or below 500° C. The carrier bond, in some embodiments, may be adhesive and according to some embodiments that adhesive may be organic. As illustrated in FIG. 4C, through the sapphire 32 and any nucleation layer is removed, leaving the GaN 54 and transistor 56 and the carrier 52. The GaN layer 54 is etched, in one embodiment, as in FIG. 4D, to remove thickness. In alternative embodiments the GaN layer 54 may be used without etching. GaN 54 may be polished and/or etched to approximately less than 1 nm roughness. A diamond layer 44 is then provided. The diamond layer 44 may be polished to a roughness of approximately 0.5-3.0 nm RMS. The diamond 44 of one embodiment of the present invention may also be approximately 1000-2500 W/mK diamond. The diamond layer 44 is then bound to the GaN layer 54. The bonding may take place at room temperature, and may comprise Van der Waal bonding. The bonding process may involve surface treatments in preparation of bonding. The carrier is then removed, as in FIG. 4G. The resulting wafer is then thermally annealed as in FIG. 4H. The thermal annealing may take place at up to approximately 400° C. to convert Van der Waal bonds to electro/covalent bonds.

In one embodiment of the present invention, GaN devices can be fabricated before diamond bonding with high yield using conventional GaN processing technology. Since diamond bonding to GaN epitaxial layers is achieved at a lower temperature (e.g. between room temperature to approximately 400° C.), the mechanical stress generated in the GaN-on-Diamond structure—which is proportional to the change in temperature during bonding temperature—is minimized, leading to low wafer bow and reduced tensile stress in the GaN epitaxial layers 54. The bonding can be made with a thin layer, high thermal conductivity bonding adhesive 46 (e.g., SiN, BN, or AlN) or through a GaN-GaN (attached on diamond) covalent bonding. Diamond substrates 44 can be mounted onto an optical-flat glass block with an adhesive such as high temperature organics or alloyed metal layers (e.g., AuGe) to provide a good flatness suitable for high yield binding to GaN. alternative embodiments of the present invention also propose a buried InAlN etch stop layer 36 in the GaN epitaxial layer 36, 40 to allow a uniform etch of GaN to thin the GaN channel layer (e.g., 0.2-1 um) after the removal of the substrate. The thin GaN layer 40 in the device, coupling with the diamond substrate 44 improves device thermal conductivity by 3-5× over conventional GaN on SiC HEMT with minimal impact from GaN/diamond CTE mismatch. The high performance GaN-on-sapphire or GaN-on-SiC epitaxial layer can be used as the starting epitaxial layer material for higher device performance.

In summary, embodiments of the present invention propose a low temperature, low stress diamond bonding technique to combine high thermal conductivity diamond substrates with GaN epitaxial layers to produce a reliable device with 3-5× higher power handling capability compared to GaN-on-SiC. The resulting performance improvements will enable higher power RF sources in smaller footprints, and major reductions in system size, weight and power (SWaP) due to associated relaxation of prime power and cooling requirements.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A GaN on Diamond wafer, the system comprising:
    a diamond layer;
    a first layer of GaN bonded on said diamond layer at a low temperature, wherein said low temperature is below 400 degrees Celsius, said first layer of GaN being substantially free of a nucleation layer;
    a second GaN layer disposed on said first GaN layer;
    an AlGaN layer disposed on said second GaN layer, opposite said first GaN layer; and
    source, gate, drain, and passivation transistor elements disposed on said AlGaN layer;
    a handling wafer disposed on said source, gate, drain, and passivation transistor elements;
    wherein said handling wafer is removed from said source, gate, drain, and passivation transistor elements following said bonding of said layer of GaN on said diamond layer; and
    at least one of passive components and transmission lines fabricated directly on said diamond layer, mitigating coefficient of thermal expansion mismatch.

2. The wafer of claim 1 wherein said second GaN layer is not greater than 0.2 μm thick.

3. The wafer of claim 1 wherein coefficient of thermal expansion mismatch between said GaN layer and said diamond layer is minimized.

4. The wafer of claim 1, further comprising GaN devices disposed on said layer of GaN prior to the bonding of said GaN layer to said diamond layer.

5. The method of claim 4 wherein said bonding comprises bonding said GaN layer to said diamond layer with a low-temperature, low thermal resistance bond.

6. The method of claim 1, wherein said low temperature is below 150 degrees Celsius.

7. A method for manufacturing a GaN on Diamond device, the method comprising:
    providing a substrate;

disposing a first GaN layer, using a low temperature polymer-based adhesive, on said substrate, having a nucleation layer disposed between said substrate and said first GaN layer;

disposing a second GaN layer on said first GaN layer;

disposing an AlGaN layer on said second GaN layer;

disposing source, gate, drain, and passivation transistor elements on said AlGaN layer;

affixing said source, gate, drain, and passivation transistor elements to a handling wafer;

removing said substrate and substantially all said nucleation layer; and bonding said GaN layer to a diamond layer; and fabricating passive components and transmission lines directly on said diamond layer, thereby mitigating coefficient of thermal expansion mismatch.

8. The method of claim 7 wherein said substrate material comprises Si.

9. The method of claim 7 further comprising thinning said GaN layer prior to bonding said GaN device to said diamond layer.

10. The method of claim 7, wherein:
said substrate layer is about 600 μm thick;
said MN nucleation layer is 200-2000 Å;
said first GaN layer is 1-3 μm thick;
said second GaN layer is 0.2-1.0 μm thick;
said AlGaN layer is 100-300 Å thick; and
said Diamond layer is 50-500 μm thick.

11. The method of claim 9 wherein said bond comprises Van der Waal bonds.

12. The method of claim 7 further comprising annealing said GaN layer bonded to said diamond layer.

13. The method of claim 12 wherein said annealing is at up to 400° C.

14. The method of claim 7 further comprising removing not more than 90% of said GaN layer.

15. The method of claim 7 wherein said step of removing said substrate and said substantially all said nucleation layer comprises mechanical removal.

16. The method of claim 7, wherein said step of removing said substrate and said substantially all said nucleation layer further comprises etching and or mechanical polishing.

17. The method of claim 7 wherein said handling wafer is attached to said GaN device with polymer-based adhesive.

18. The method of claim 7 further comprising removing said handling wafer.

19. The method of claim 7 further comprising smoothing said diamond layer before bonding said GaN layer to said diamond substrate.

20. The method of claim 7, wherein:
said substrate layer is 600 μm thick;
said MN nucleation layer is 500 Å thick;
said first GaN layer is 1.5 μm thick;
said second GaN layer is 0.2 μm thick;
said AlGaN layer is 190 Å thick;
said Diamond layer is 100 μm thick;
said Diamond layer is polished to a roughness of 0.5-3.0 nm RMS; and
said first GaN layer is polished to less than 1 nm roughness.

* * * * *